United States Patent
Huber

(10) Patent No.: US 10,338,476 B2
(45) Date of Patent: Jul. 2, 2019

(54) REFLECTIVE OPTICAL ELEMENT

(71) Applicant: Carl Zeiss SMT GmbH, Oberkochen (DE)

(72) Inventor: Peter Huber, Heidenheim (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 16/011,019

(22) Filed: Jun. 18, 2018

(65) Prior Publication Data
US 2018/0307142 A1 Oct. 25, 2018

Related U.S. Application Data

(63) Continuation of application No. PCT/EP2016/078343, filed on Nov. 21, 2016.

(30) Foreign Application Priority Data

Dec. 16, 2015 (DE) ......................... 10 2015 225 509

(51) Int. Cl.
*G03F 7/20* (2006.01)
*G03F 1/24* (2012.01)
(Continued)

(52) U.S. Cl.
CPC .............. *G03F 7/7015* (2013.01); *G03F 1/24* (2013.01); *G03F 1/84* (2013.01); *G03F 7/70316* (2013.01);
(Continued)

(58) Field of Classification Search
CPC . G03F 1/24; G03F 1/84; G03F 7/7015; G03F 7/70316; G03F 7/70891;
(Continued)

(56) References Cited

U.S. PATENT DOCUMENTS

| 2002/0075466 A1* | 6/2002 | Gruner ................... G02B 17/08 355/53 |
| 2004/0009410 A1 | 1/2004 | Lercel et al. |

(Continued)

FOREIGN PATENT DOCUMENTS

| DE | 102004060184 A1 | 7/2006 |
| DE | 102009044462 A1 | 7/2006 |

(Continued)

OTHER PUBLICATIONS

International Search Report (with English translation) and Written Opinion in counterpart International Application No. PCT/EP2016/078343, dated Mar. 16, 2017, 17 pages.
(Continued)

Primary Examiner — Michelle M Iacoletti
(74) Attorney, Agent, or Firm — Edell, Shapiro & Finnan, LLC

(57) ABSTRACT

A reflective optical element, in particular for a microlithographic projection exposure apparatus or a mask inspection apparatus. According to one aspect, the reflective optical element has an optically effective surface, a substrate (405, 505), a reflection layer system (410, 510) and at least one porous outgassing layer (450, 550), which at least intermittently releases particles adsorbed in the outgassing layer (450, 550) when the optically effective surface (400*a*, 500*a*) is irradiated by electromagnetic radiation.

21 Claims, 9 Drawing Sheets

(51) Int. Cl.
  *G21K 1/06* (2006.01)
  *G03F 1/84* (2012.01)
(52) U.S. Cl.
  CPC ...... *G03F 7/70891* (2013.01); *G03F 7/70958* (2013.01); *G21K 1/062* (2013.01); *G21K 2201/065* (2013.01)
(58) Field of Classification Search
  CPC .. G03F 7/70958; G03F 7/702; G03F 7/70266; G03F 7/70925; G03F 7/70983; G03F 1/52; G03F 2007/2067; G03F 7/70191; G03F 7/70216; G03F 7/70883; G03F 7/70916; G03F 7/7095; G03F 1/138; G03F 7/70875; G21K 1/062; G21K 2201/065; G02B 5/0891; G02B 7/181; G02B 1/14; G02B 27/0006; G02B 5/0875; G02B 7/008; G02B 7/1815; G02B 5/0816
  See application file for complete search history.

(56) References Cited

U.S. PATENT DOCUMENTS

| | | | |
|---|---|---|---|
| 2007/0259275 A1 | 11/2007 | Van Herpen et al. | |
| 2011/0297852 A1 | 12/2011 | Kameda et al. | |
| 2013/0141707 A1* | 6/2013 | Baer | B82Y 10/00 355/67 |
| 2013/0176545 A1 | 7/2013 | Ehm et al. | |
| 2015/0116703 A1 | 4/2015 | Bittner et al. | |
| 2015/0168674 A1 | 6/2015 | Bittner et al. | |
| 2016/0041480 A1 | 2/2016 | Hauf | |
| 2016/0187543 A1 | 6/2016 | Bekman et al. | |
| 2017/0160639 A1 | 6/2017 | Ehm et al. | |

FOREIGN PATENT DOCUMENTS

| | | |
|---|---|---|
| DE | 102010039930 A1 | 3/2012 |
| DE | 102011080052 A1 | 1/2013 |
| DE | 102012212898 A1 | 1/2014 |
| DE | 102013204427 A1 | 9/2014 |
| DE | 102013102670 A1 | 10/2014 |
| DE | 102014206765 A1 | 10/2015 |
| DE | 102014222534 A1 | 11/2015 |
| DE | 102014216240 A1 | 2/2016 |
| WO | 2013014182 A1 | 1/2013 |
| WO | 2015155061 A1 | 10/2015 |

OTHER PUBLICATIONS

GPTO Office Action for DE102015225509.3 English Translation dated Jul. 12, 2016, 6 pages.
GPTO Office Action for DE102015225509.3 dated Jul. 12, 2016, 9 pages.
International Search Report (with English translation) and Written Opinion in counterpart International Application No. PCT/EP2016/078343, dated Jun. 19, 2018, 19 pages.

* cited by examiner

REFLECTIVE OPTICAL ELEMENT

The present application is a continuation of International Application No. PCT/EP2016/078343, filed Nov. 21, 2016, which claims the priority under 35 U.S.C. § 119(a) of the German patent application DE 10 2015 225 509.3, filed on Dec. 16, 2015. The disclosures of both related applications are considered part of and are incorporated by reference into the disclosure of the present application in their respective entireties.

FIELD OF THE INVENTION

The invention relates to a reflective optical element, in particular for a microlithographic projection exposure apparatus or for a mask inspection apparatus.

BACKGROUND

Microlithography is used for producing microstructured components such as, for example, integrated circuits or LCDs. The microlithography process is carried out in what is called a projection exposure apparatus, which comprises an illumination device and a projection lens. The image of a mask (=reticle) illuminated by way of the illumination device is in this case projected by way of the projection lens onto a substrate (e.g. a silicon wafer) coated with a light-sensitive layer (photoresist) and arranged in the image plane of the projection lens, in order to transfer the mask structure to the light-sensitive coating of the substrate.

Mask inspection apparatus are used for the inspection of reticles for microlithographic projection exposure apparatus.

In projection lenses or inspection lenses designed for the EUV range, i.e. at wavelengths of e.g. approximately 13 nm or approximately 7 nm, owing to the lack of availability of suitable light-transmissive refractive materials, reflective optical elements are used as optical components for the imaging process.

One problem which arises in practice is that, in particular as a result of the absorption of the radiation emitted by the EUV light source, these reflective optical elements designed for operation in the EUV heat up and thus undergo an associated thermal expansion or deformation, which in turn can negatively affect the imaging properties of the optical system. This is the case in particular if illumination settings with comparatively small illumination poles are used (e.g. in dipole or quadrupole illumination settings), in which the element warming or deformation varies strongly over the optically effective surface of the reflective optical element.

Resorting to solutions for overcoming the aforementioned problem of element heating in EUV systems that are known from VUV lithography systems (with an operating wavelength of approximately 200 nm or approximately 160 nm, for example) is difficult. This is so in part because, inter alia, the number of optically effective surfaces available for active deformation compensation is relatively tightly delimited due to the comparatively smaller number of optical elements or mirrors (for avoiding light losses that are too great on account of the necessary reflections).

In order to overcome the aforementioned problem of element heating in EUV systems, the practice of using additional appliances for realizing rigid body movements and/or temperature changes in the region of the optically effective surface of the reflective optical elements designed for the operation in EUV, in particular, is known, although this increases the complexity of the systems.

Regarding the prior art, reference is made by way of example to DE 10 2010 039 930 A1.

SUMMARY

It is an object of the present invention to provide a reflective optical element, in particular for a microlithographic projection exposure apparatus or for a mask inspection apparatus, said reflective optical element facilitating an effective avoidance of, or at least reduction in, thermal deformations or the negative effects accompanying this on the imaging behavior using comparatively little constructive outlay.

This object is achieved by way of reflective optical elements as recited, e.g., in the independent patent claims.

According to one aspect, the invention relates to a reflective optical element, in particular for a microlithographic projection exposure apparatus or a mask inspection apparatus, wherein the reflective optical element has an optically effective surface, having:

a substrate;

a reflection layer system; and at least one porous outgassing layer, which at least intermittently releases particles adsorbed in the outgassing layer when the optically effective surface is irradiated by electromagnetic radiation.

According to this aspect, the invention contains the concept of limiting the heating of the reflective optical element in the vicinity of the optically effective surface or in the region of the reflection layer system during operation by virtue of the heat induced by the electromagnetic radiation (i.e., during a light pulse) in the reflective optical element being used in part to release particles absorbed in a porous outgassing layer especially provided to this end. As a consequence, correspondingly less energy is available in the surface-near region for the purposes of heating the reflective optical element; i.e., a corresponding temperature increase is also lower accordingly.

Purely by way of example, the adsorbed particles can be stored water molecules, with the radiation-induced heat then being used accordingly to evaporate the water. In further embodiments, these can also be stored noble gases (e.g., argon (Ar)).

In the concept of using the porous outgassing layer described above, it should be noted that absorption energy or heat is typically released again during the period of time between the light pulses being incident on the reflective optical element on account of the renewed storage of the previously absorbed particles occurring at that point. However, the last-mentioned effect occurs on a comparatively significantly longer time-scale, and so active cooling of the system can take place, for example between the light pulses being incident on the reflective optical element.

As a result, using the above-described concept renders it possible to achieve lowering of the maximally occurring peak temperatures and hence, in particular, protection of comparatively temperature-sensitive layers and/or reflection layer systems of the reflective optical element, for instance.

According to an embodiment, this outgassing layer is arranged on the side of the reflection layer system facing the substrate.

According to an embodiment, the reflective optical element has a first porous outgassing layer and a second porous outgassing layer, wherein the second outgassing layer is designed in such a way that particles released by the first outgassing layer when the optically effective surface is irradiated by electromagnetic radiation are at least intermittently adsorbed in the second outgassing layer.

According to an embodiment, the reflective optical element has at least one heat radiation layer that, in comparison with an analogous structure without the heat radiation layer, increases a radiation of heat induced by the electromagnetic radiation in the reflective optical element when the optically effective surface is irradiated by electromagnetic radiation.

According to a further aspect, a reflective optical element according to the invention, in particular for a microlithographic projection exposure apparatus or for a mask inspection apparatus, wherein the reflective optical element has an optically effective surface, has:
- a substrate;
- a reflection layer system; and
- at least one heat radiation layer that, in comparison with an analogous structure without the heat radiation layer, increases a radiation of heat induced by the electromagnetic radiation in the reflective optical element when the optically effective surface is irradiated by electromagnetic radiation.

According to this aspect, the invention is based, in particular, on the concept of at least reducing an unwanted thermally caused deformation of a reflective optical element as a consequence of the electromagnetic radiation incident during operation by virtue of providing dissipation of infrared (IR) radiation that is as effective as possible by way of a heat radiation layer.

Here, in particular, the invention makes use of the fact that in an EUV mirror, for instance, the substrate or the substrate materials typically employed for the production thereof are at least partly transparent to IR radiation, with the consequence that the heat dissipation according to the invention via the heat radiation layer can be effected through the substrate.

In particular, the invention takes account of the fact that thermally caused deformations on the part of the substrate are particularly problematic, firstly in respect of the wavefront effects occurring at the reflective optical element (on account of the substrate thickness being several orders of magnitude greater in comparison with the reflection layer system) and secondly because they cannot be completely avoided as a rule during operation, even by the selection of specific substrate materials (such as Zerodur® or ULE®, for instance). The last-mentioned fact can also be traced back to the so-called zero-crossing temperature, at which the coefficient of thermal expansion of such substrate materials has a zero crossing in terms of its temperature dependence, cannot be exactly adjustable, especially since the temperature ultimately setting in during operation varies over the optically effective surface, and hence also over the substrate cross section.

According to an embodiment, the heat radiation layer is arranged on the side of the reflection layer system facing the substrate. This configuration is advantageous in that, when designing the heat radiation layer, the optimization thereof can be implemented in view of the IR radiation—in particular in relation to material and thickness of the heat radiation layer—without considering the radiation or emission properties of the radiation layer for the electromagnetic used radiation (EUV radiation in the case of an EUV mirror, for example) that is incident on the reflective optical element during operation. Expressed differently, the emission properties (and hence also the absorption properties) of the heat radiation layer for the electromagnetic used radiation or operating wavelength can be neglected should the heat radiation layer be arranged on the side of the reflection layer system facing the substrate.

According to a further embodiment, the heat radiation layer is arranged on the side of the reflection layer system facing the optically effective surface. In this case, the heat radiation layer is preferably configured in such a way that the absorption of the electromagnetic used radiation (EUV radiation in the case of an EUV mirror, for example) that is incident on the reflective optical element during operation is as low as possible.

According to an embodiment, the reflective optical element according to the invention further has a heat insulation layer, which is arranged between substrate and reflection layer system. What this can achieve is that the heat induced during the operation of the reflective optical element substantially remains in the reflection layer system and consequently does not reach as far as the substrate. As a consequence, a greater time interval is available for the heat dissipation via the IR radiation from the optically effective surface on the one hand and this IR radiation is assisted on account of the temperature increase in the reflection layer system on the other hand.

This configuration is based on the further consideration that a heat influx into the reflection layer system is less problematic in view of the wavefront effect occurring at the reflective optical element than a heat influx into the substrate (where a thermally induced relative expansion has a substantially more serious effect on the wavefront effect on account of the absolute thickness of the substrate that is several orders of magnitude higher in comparison with the reflection layer system).

According to an embodiment, the reflective optical element further has at least one Peltier element, which is arranged between the substrate and the reflection layer system.

This embodiment is based on the further concept of achieving active cooling of the substrate (in particular a controllable cooling as well) by using a Peltier element, to which an electric current can be applied, between substrate and reflection layer system during operation as required—for example, should the temperature of the substrate threaten to rise—wherein there is a temperature increase on the side facing the reflection layer system in this case, corresponding to the functional principle of the Peltier element. In turn, this is based on the consideration that, typically, a heat influx into the reflection layer system, as already mentioned, is less problematic than a heat influx into the substrate (on account of the thickness of said reflection layer system being orders of magnitude smaller in comparison with the substrate).

The invention further relates to a reflective optical element, in particular for a microlithographic projection exposure apparatus or a mask inspection apparatus, wherein the reflective optical element has an optically effective surface, having:
- a substrate;
- a reflection layer system; and
- a Peltier element, which is arranged between the substrate and the reflection layer system.

According to an embodiment, the reflective optical element according to the invention further has a heat buffer layer, which is arranged between the substrate and the reflection layer system.

What this can achieve is that the heat introduced into the reflective optical element while light pulses are incident thereon is transferred comparatively quickly from the reflection layer system to the heat buffer layer 890, and so a temperature increase that is too high is avoided on the part of the reflection layer system and, where applicable, it is possible to protect temperature-sensitive layers and/or layer systems. The heat can be transferred from the heat buffer layer to the substrate in the time intervals between the light pulses.

According to an embodiment, the reflective optical element is designed for an operating wavelength of less than 30 nm, in particular less than 15 nm. However, the invention is not limited thereto, and the invention can also be realized advantageously in further applications in an optical system having an operating wavelength in the VUV range (for example of less than 200 nm or less than 160 nm).

The reflective optical element according to the invention can be a mirror, in particular a mirror for a microlithographic projection exposure apparatus or a mirror for a mask inspection apparatus. Moreover, the reflective optical element according to the invention can also be a reticle for a microlithographic projection exposure apparatus.

The invention further relates to an optical system of a microlithographic projection exposure apparatus, in particular an illumination device or a projection lens, an optical system of a mask inspection apparatus, and also a microlithographic projection exposure apparatus and a mask inspection apparatus having at least one reflective optical element with the above-described features.

Further configurations of the invention can be gathered from the description and the dependent claims.

The invention is explained in greater detail below on the basis of exemplary embodiments illustrated in the accompanying figures.

DETAILED DESCRIPTION

Figure 1:
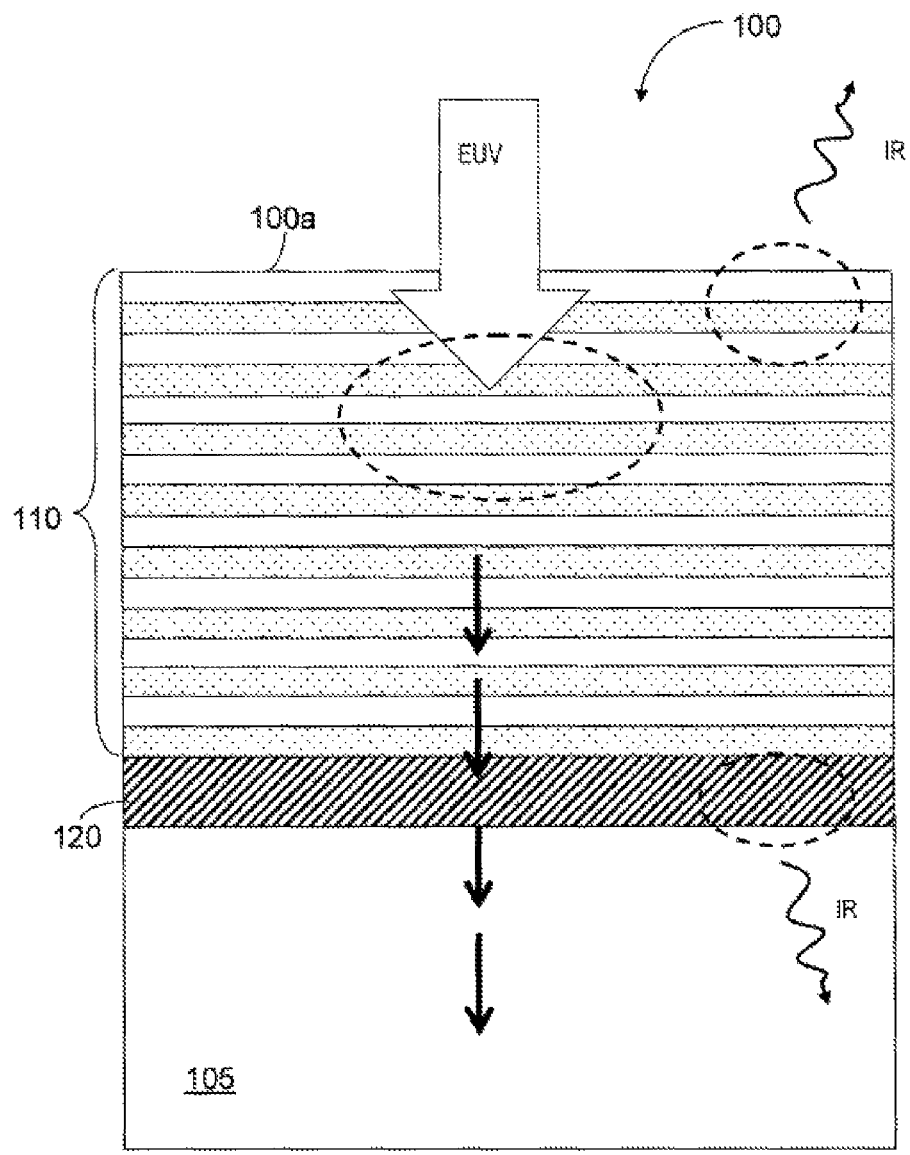
FIG. 1 shows a schematic illustration for explaining the construction of a reflective optical element according to a first embodiment of the invention.

FIG. 1 shows a schematic illustration for describing the construction of a reflective optical element according to the invention in a first embodiment of the invention.

The reflective optical element 100 comprises, in particular, a substrate 105, which is made from any desired suitable (mirror) substrate material. Suitable substrate materials are e.g. quartz glass doped with titanium dioxide ($TiO_2$), with, merely by way of example (and without the invention being restricted thereto), materials that are usable being those sold under the trade names ULE® (by Corning Inc.) or Zerodur® (by Schott AG).

Furthermore, the reflective optical element 100 has, in a manner known per se in principle, a reflection layer system 110, which in the embodiment illustrated comprises merely by way of example a molybdenum-silicon (Mo—Si) layer stack. Without the invention being restricted to specific configurations of this layer stack, one suitable construction that is merely exemplary can comprise approximately 50 plies or layer packets of a layer system comprising molybdenum (Mo) layers having a layer thickness of 2.7 nm in each case and silicon (Si) layers having a layer thickness of 3.3 nm in each case. Optionally, further functional layers, such as, e.g., a capping layer ("cap layer"), a substrate protection layer (SPL="substrate protection layer") and/or diffusion barriers, can be provided.

In particular, the reflective optical element 100 can be a reflective optical element or a mirror of an optical system, in particular of the projection lens or of the illumination device of a microlithographic projection exposure apparatus or of the inspection lens of a mask inspection apparatus. Moreover, the optical element or the optical system can be designed, in particular, for the operation in the EUV.

The impingement of an optically effective surface 100a of the reflective optical element 100 with electromagnetic EUV radiation (indicated by an arrow in FIG. 1) that occurs during the operation of the optical system has as a consequence that there is an increase in the volume of both the reflection layer system 110 and the substrate 105, wherein this volumetric increase may extend in inhomogeneous fashion over the optically effective surface 100a depending on the intensity distribution of the incident electromagnetic radiation (thus, in particular, depending on the set illumination setting in the case of a near-pupil reflective optical element).

In order now to at least partly reduce the deformation of the reflective optical element 100 overall caused by said irradiation of the optically effective surface 100a by electromagnetic radiation and, in particular, the deformation of the optically effective surface 100a and a wavefront effect consequently accompanying this during the operation of the reflective optical element 100, the reflective optical element 100 has a heat radiation layer 120 which, according to FIG. 1, is situated on the side of the reflection layer system 110 facing away from the optically effective surface 100a.

This heat radiation layer 120 is distinguished by a comparatively high emissivity for infrared (IR) radiation such that heat dissipation occurs through the substrate 105 by way of the heat radiation layer 120. On account of this heat dissipation, the correspondingly dissipated radiation-induced heat is no longer available for producing a thermally caused deformation, in particular of the substrate 105 or of the optically effective surface 100a, and so, overall, such a deformation is avoided or at least reduced.

Figure 2:
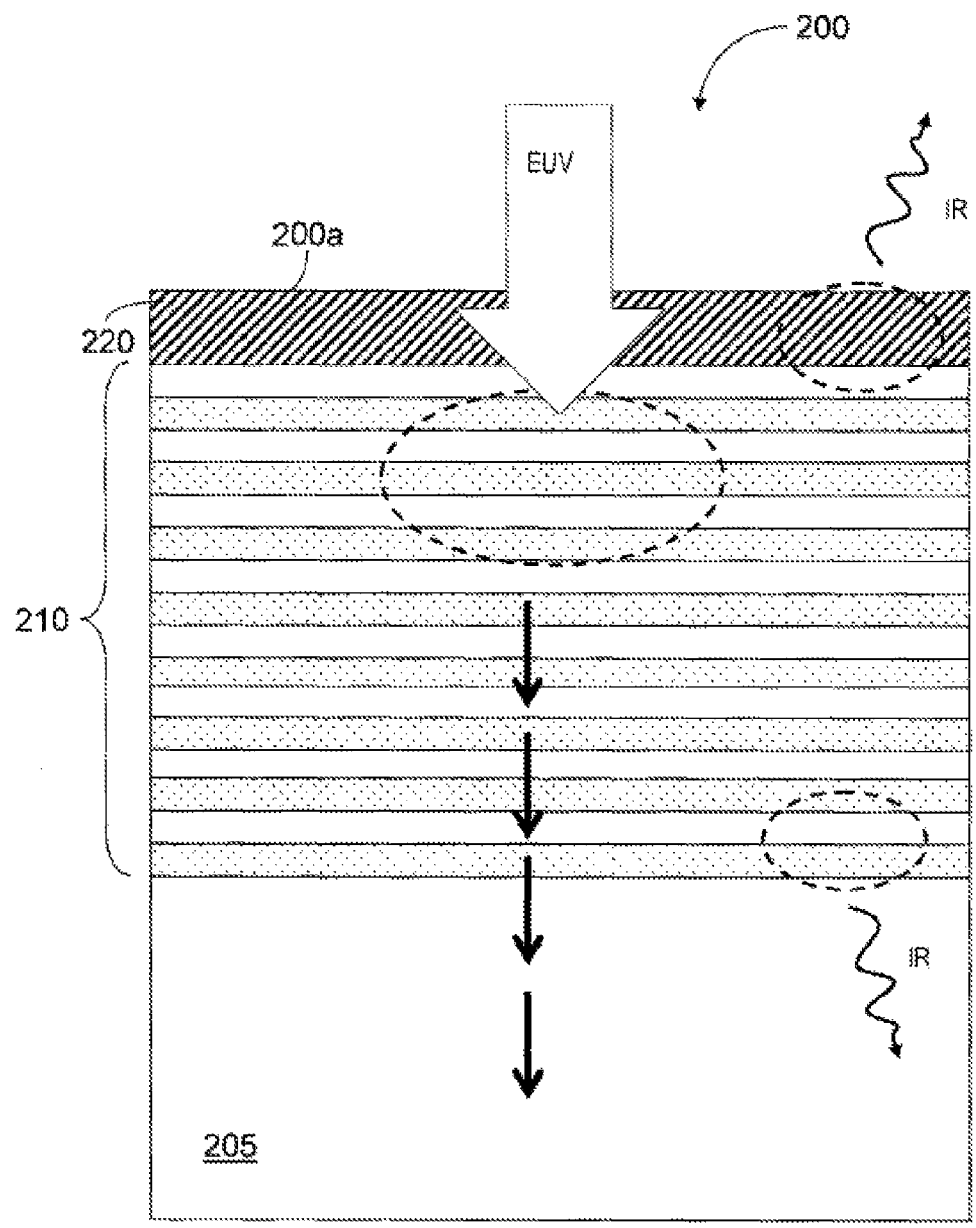
FIGS. 2-5 show schematic illustrations for explaining the construction of a reflective optical element according to further embodiments of the invention.

FIG. 2 shows a further embodiment, wherein components analogous or substantially functionally identical to FIG. 1 are designated by reference numerals increased by "100". The embodiment of FIG. 2 differs from that of FIG. 1 in that the heat radiation layer 220 is arranged on the side of the reflection layer system 210 facing the optically effective surface 200a. Preferably, the heat radiation layer 220 is configured in such a way in this embodiment that, although it has an emissivity that is as high as possible for the IR radiation to be dissipated, only a low emissivity (as this is synonymous to a low absorption capacity) is present for the electromagnetic used radiation or EUV radiation incident on the reflective optical element 200 during operation.

Suitable materials for the heat radiation layer 220 and/or 120 are, for example, niobium oxide (NbO), silicon nitride (SiN), zirconium oxide (ZrO) or amorphous carbon (C).

In embodiments, the heat radiation layer 220 and/or 120 can also have doping (of a silicon (Si) or molybdenum (Mo)

layer, for example) with one or more of the aforementioned materials (for example, doping with 10% carbon atoms). As a result of this, it is possible, as desired, to obtain a comparatively negligible influence on the emission properties of the reflection layer system for the EUV radiation forming the used light, while the emissivity for IR radiation is significantly increased.

Typical thicknesses of the heat radiation layer 220 and/or 120 can lie in the range of 5 nm to 100 nm, for example, depending on the material, wherein, in principle, the placement of the heat radiation layer 120 on the side of the reflection layer system 110 facing the substrate 105, realized in FIG. 1, facilitates comparatively larger thicknesses and also a greater flexibility in respect of the material selection (since there is no need to take account of the radiation or emission properties for EUV radiation, which are irrelevant in this case).

Figure 3:
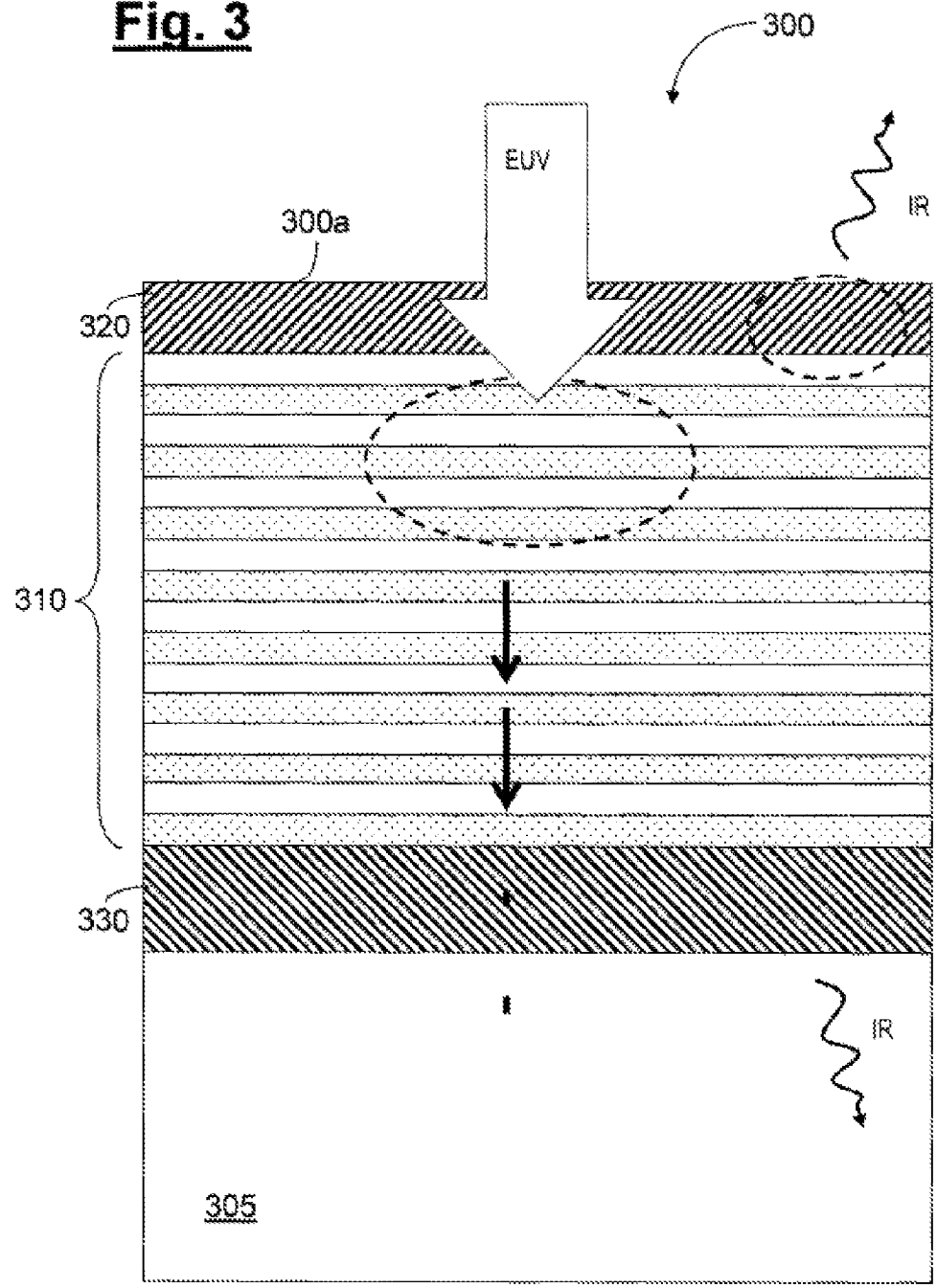

FIG. 3 shows a further embodiment of a reflective optical element 300 according to the invention, wherein components analogous or substantially functionally identical to FIG. 2 are designated by reference numerals increased by "100".

The embodiment of FIG. 3 differs from that of FIG. 2 in that, according to FIG. 3, an additional heat insulation layer 330 is arranged between the reflection layer system 310 and the substrate 305. This achieves a longer stay of the radiation-induced heat in the reflection layer system 310, with the consequence that a longer time interval is also available for the heat dissipation by the IR radiation by the heat radiation layer 320.

A suitable material for the heat insulation layer 330 is amorphous fused silica ($SiO_2$), with the thickness thereof in view of the placement on the side of the reflection layer system 310 facing away from the optically effective surface 300a being comparatively uncritical and being able to be, purely by way of example, in the region of several 10 nm or several 100 nm.

Figure 4:
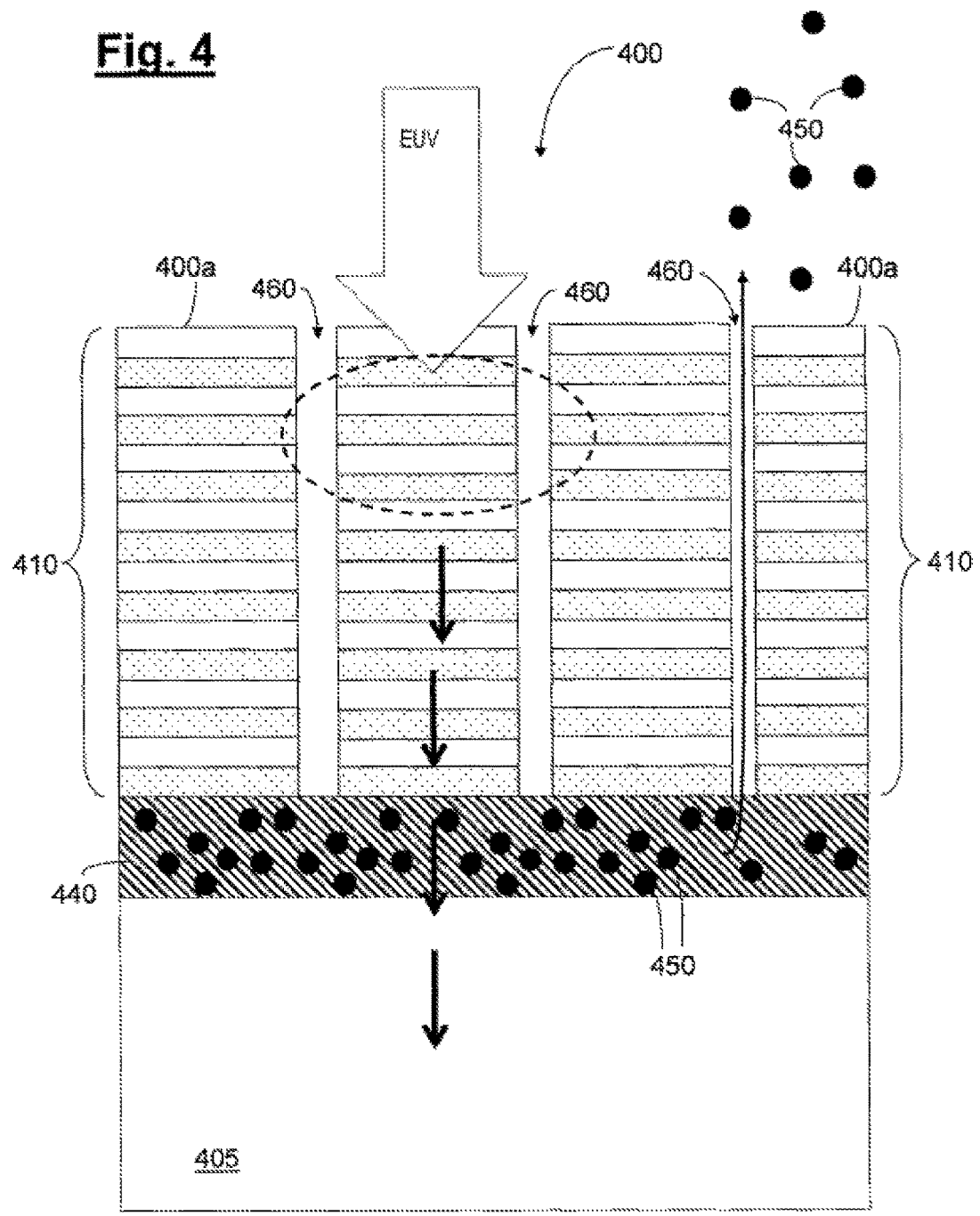

FIG. 4 shows a further embodiment of a reflective optical element 400 according to the invention, wherein components once again analogous or substantially functionally identical to FIG. 3 are designated by reference numerals increased by "100".

In contrast to the embodiments described above, the reflective optical element 400 according to FIG. 4 has a porous outgassing layer 440, which is arranged between the reflection layer system 410 and the substrate 405 in the exemplary embodiment. The thickness of the porous outgassing layer 440 can be, purely by way of example, in the range from 1 μm to 10 μm.

The outgassing layer 440 serves to temporarily store particles or molecules (e.g., water or a noble gas such as argon (Ar), for example). Releasing these stored or absorbed particles using the heat introduced into the reflective optical element 400 when light pulses are incident on the optically effective surface 400a has as a consequence that correspondingly less energy is available in the surface-near region of the reflective optical element 400 (i.e., in the vicinity of the optically effective surface 400a) and hence a temperature increase, in particular of the reflection layer system 410, also turns out to be lower in comparison with an analogous construction without the outgassing layer 440.

Figure 6:
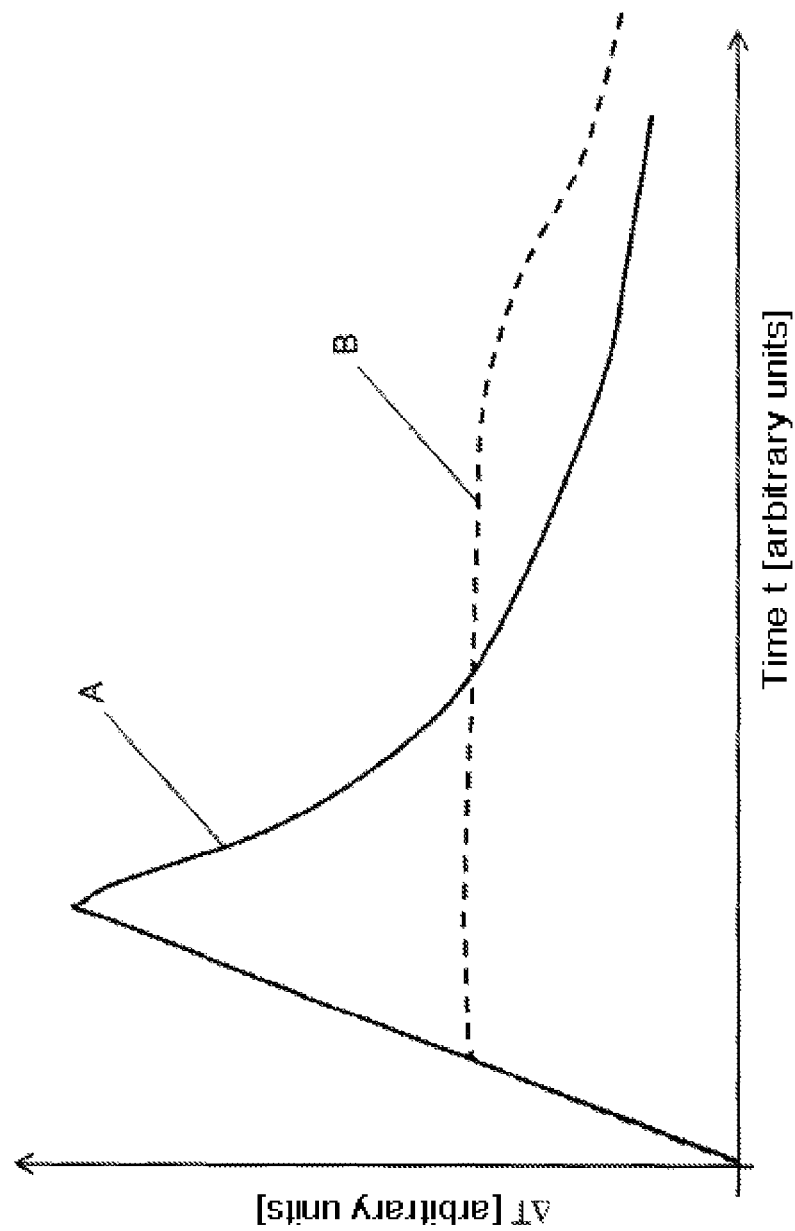
FIG. 6 shows a diagram for explaining the mode of operation of a reflective optical element according to a further embodiment of the invention.

Although the previously desorbed particles are once again stored in the outgassing layer 440 between successive light pulses, with absorption energy being released, a reduction in the maximum peak temperatures occurring and consequently a protection of, in particular, temperature-sensitive reflection layer systems 410 can be obtained. This is indicated in FIG. 6 on the basis of a comparison of two typical curves for the time dependence of the increase in temperature ΔT in the surface-near region without (curve "A") and with (curve "B") the presence of the outgassing layer 440.

It is further clear from FIG. 4 that the reflective optical element 400 further has defects 460 in the exemplary embodiment, said defects facilitating an emergence of the released or desorbed particles. Such defects 460 can be provided in any suitable way, for example in the form of carbon nanotubes, by way of a suitable etching method, etc.

Figure 5:
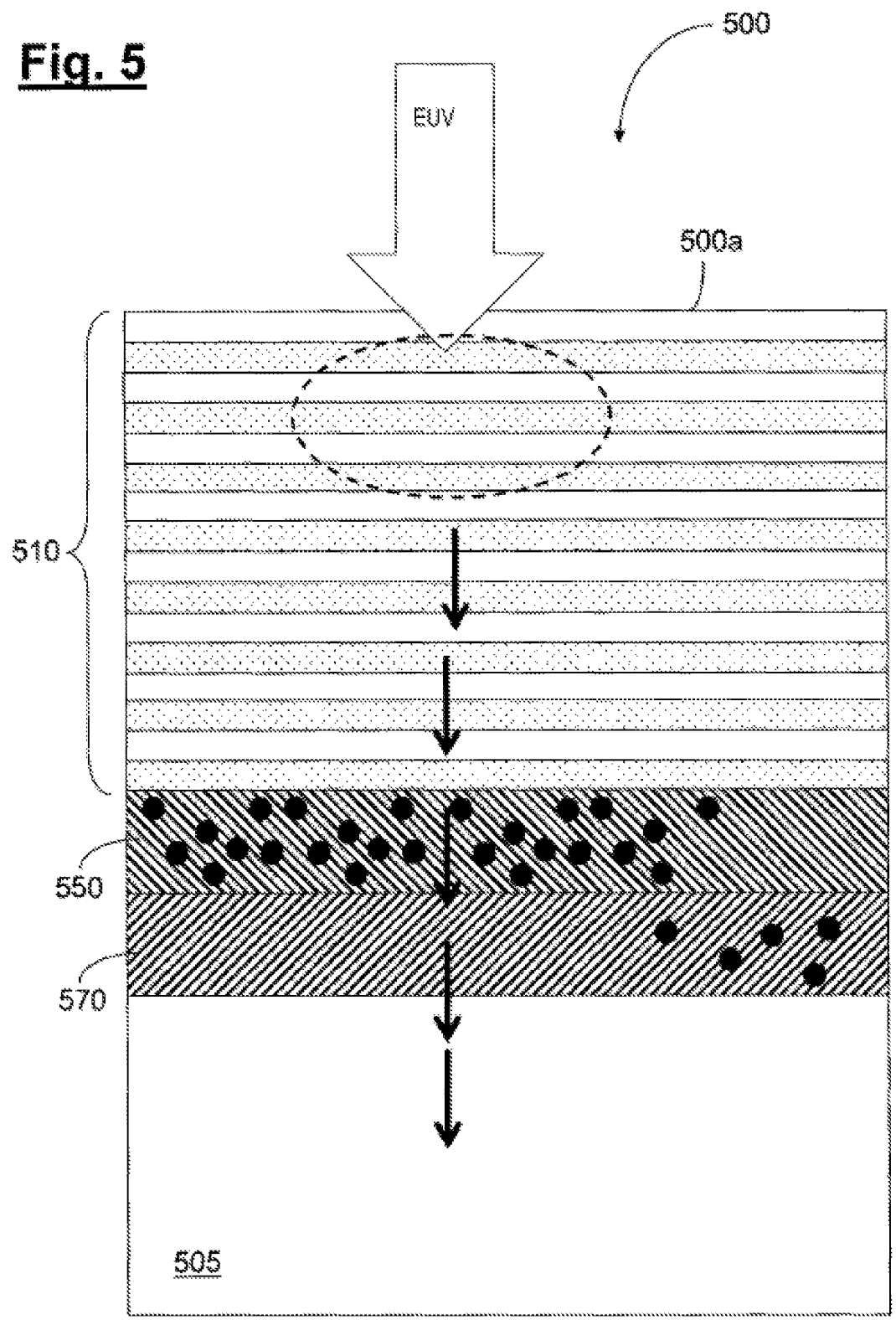

FIG. 5 shows a further embodiment of a reflective optical element 500 according to the invention, wherein components analogous or substantially functionally identical to FIG. 4 are designated by reference numerals increased by "100".

The embodiment of FIG. 5 differs from that of FIG. 4 in that a further outgassing layer 570 is provided in addition to the outgassing layer 550 on the side of the latter facing the substrate 505. The particles that were driven out of the outgassing layer 550 as described above can be buffered in this further outgassing layer 570 such that, where applicable, it is possible in this embodiment to dispense with the defects 460 present in the reflective optical element 400 of FIG. 4.

There can be active cooling between successive light pulses in each case in the embodiments of FIGS. 4 and 5 in order to correspondingly dissipate heat that arises with the release of absorption energy.

Figure 7:
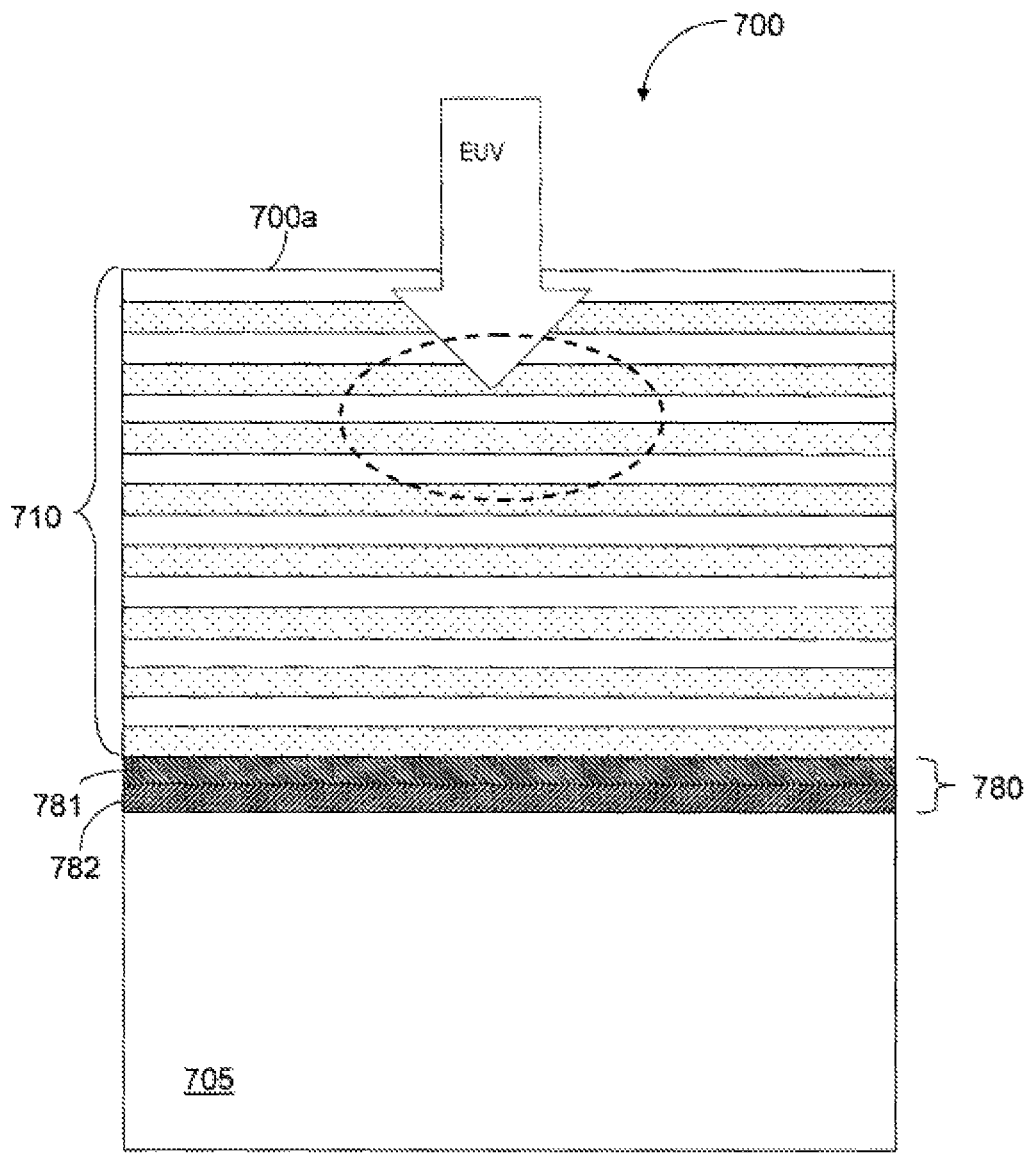
FIGS. 7-8 show schematic illustrations for explaining the construction of a reflective optical element according to further embodiments of the invention.

FIG. 7 shows a corresponding further embodiment of a reflective optical element 700 according to the invention, wherein components analogous or substantially functionally identical to FIG. 4 are designated by reference numerals increased by "100". Arranged between the substrate 705 and the reflection layer system 710 in this embodiment is a Peltier element 780, which is constructed from Peltier layers 781, 782 and to which an electric current is appliable by way of electrodes (not plotted here).

In this way, it is possible to obtain cooling of the substrate 705 at a cost of heating of the reflection layer system 710, with, once again, the circumstances already explained at the outset that, depending on the specific construction of the reflective optical element, a heat influx into the reflection layer system is comparatively unproblematic in comparison with a heat influx into the substrate being exploited.

The use of a Peltier element 780 described above can also, in particular, be advantageously combined with the presence of a heat radiation layer 220 and/or 320, for example according to FIG. 2 or FIG. 3, since the heat additionally introduced into the reflection layer system 210 and/or 310 by way of the Peltier element 780 can be effectively dissipated in this way.

Figure 8:
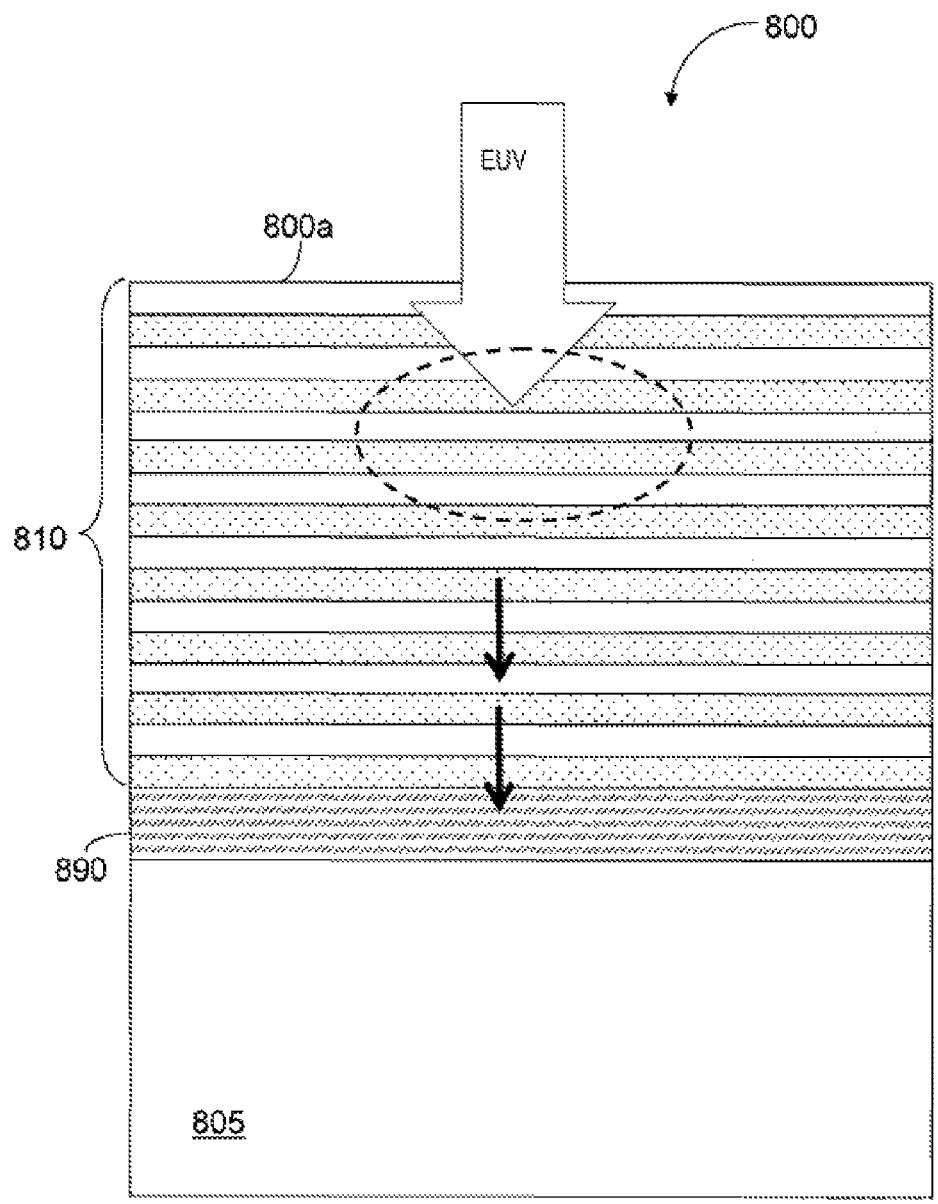

FIG. 8 shows a further embodiment of a reflective optical element 800 according to the invention, wherein components analogous or substantially functionally identical to FIG. 7 are designated by reference numerals increased by "100".

According to FIG. 8, the reflective optical element 800 according to the invention has a heat buffer layer 890, which can be arranged between the reflection layer system 810 and substrate 805 and which has a comparatively high heat capacity. What this can achieve is that the heat introduced into the reflective optical element 800 while light pulses are incident thereon is transferred comparatively quickly from the reflection layer system 810 to the heat buffer layer 890, and so a pronounced temperature increase can be avoided on the part of the reflection layer system 810 (and, once again analogous to FIGS. 4 to 6, for example, and where applicable, it is possible to protect temperature-sensitive layers and/or layer systems). On account of this configuration, it is possible to take account of the circumstances that typical substrate materials, as a rule, have a comparatively low thermal conductivity, and so heat accumulation caused thereby within the reflection layer system can lead to damage of the layer construction in the case of temperature-sensitive layers.

The heat can be transferred from the heat buffer layer 890 to the substrate 805 in time intervals between the light pulses. As a consequence of the heat dissipation by way of the heat buffer layer 890 described above, it is possible to achieve a lowering of the peak temperatures occurring in the region of the reflection layer system 810. By way of example, the heat buffer layer 890 can have a material which exhibits a phase transition at the operating temperature, wherein particularly efficient buffering of the heat can be obtained in this case on account of the phase transformation occurring here.

Even though the embodiments described above in each case show a mirror with a reflection layer system in the form of a multiple layer system or layer stack (made of molybdenum (Mo) and silicon (Si) layers, for example), the invention is not restricted thereto. In further embodiments, the reflection layer system can also be an individual layer, for example a ruthenium (Ru) layer of a mirror designed for operation under grazing incidence (also referred to as a GI Mirror; GI="grazing incidence").

Figure 9:
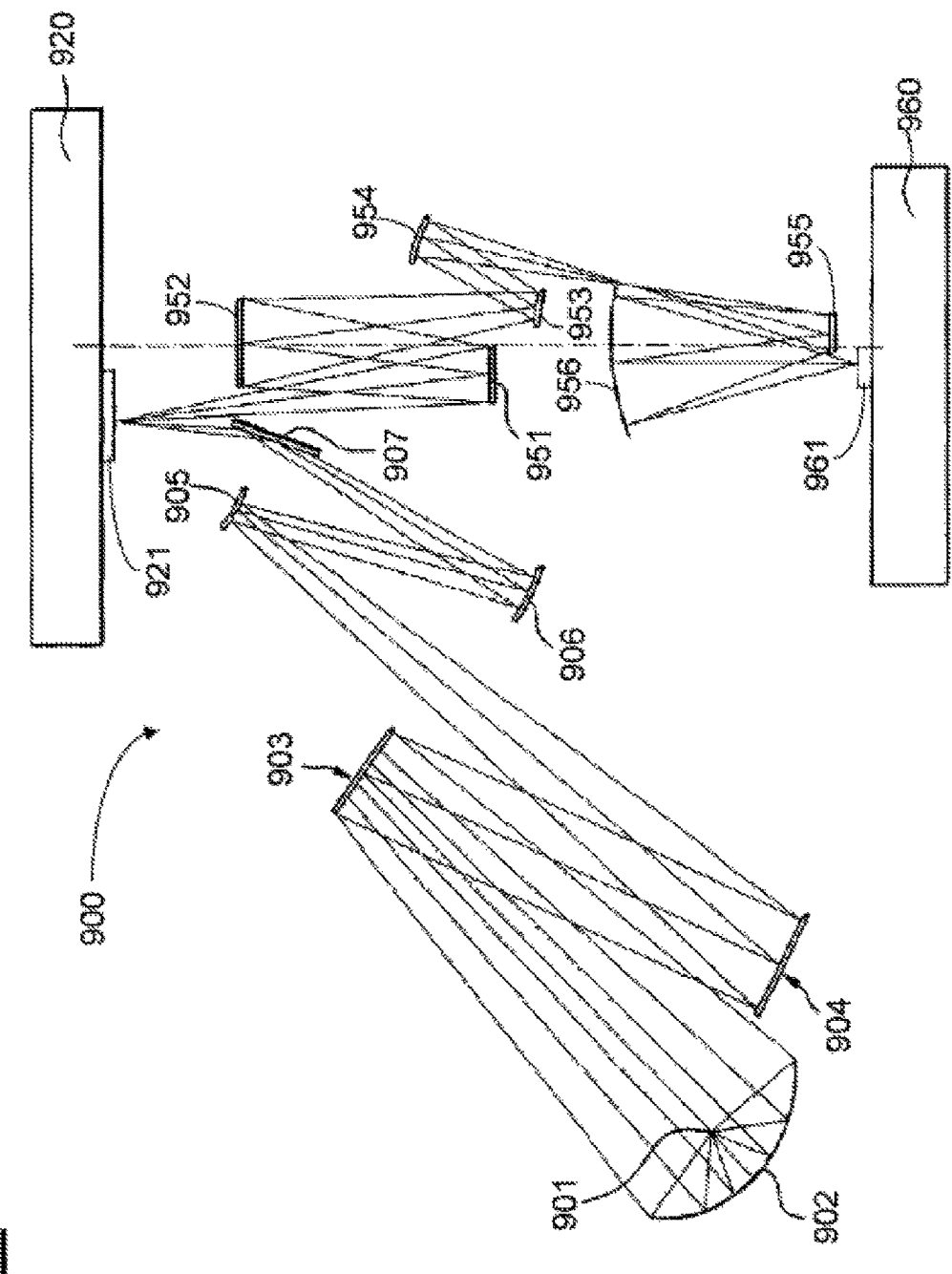
FIG. 9 shows a schematic illustration for explaining the possible construction of a microlithographic projection exposure apparatus designed for operation in EUV.

FIG. 9 shows a schematic illustration of an exemplary projection exposure apparatus which is designed for operation in the EUV and in which the present invention can be realized. According to FIG. 9, an illumination device in a projection exposure apparatus 900 designed for EUV comprises a field facet mirror 903 and a pupil facet mirror 904. The light from a light source unit comprising a plasma light source 901 and a collector mirror 902 is directed onto the field facet mirror 903. A first telescope mirror 905 and a second telescope mirror 906 are arranged in the light path downstream of the pupil facet mirror 904. A deflection mirror 907 is arranged downstream in the light path, said deflection mirror directing the radiation that is incident thereon onto an object field in the object plane of a projection lens comprising six mirrors 951-956. At the location of the object field, a reflective structure-bearing mask 921 is arranged on a mask stage 920, said mask being imaged with the aid of the projection lens into an image plane in which a substrate 961 coated with a light-sensitive layer (photoresist) is situated on a wafer stage 960.

Out of the mirrors 951-956 of the projection lens, it is in particular the mirrors 951 and 952—arranged in the starting area of the projection lens with respect to the optical beam path—that can be designed in the manner according to the invention, since the effect attained according to the invention is particularly noticeable as a result of the at said mirrors 951, 952—on the basis of the still comparatively low summed reflection losses and hence relatively high light intensities. However, the invention is not restricted to application to these mirrors 951, 952, and so, in principle, other mirrors can also be designed in the manner according to the invention.

Even though the invention has been described on the basis of specific embodiments, numerous variations and alternative embodiments are apparent to a person skilled in the art, for example by combination and/or exchange of features of individual embodiments. Accordingly, such variations and alternative embodiments are concomitantly encompassed by the present invention, and the scope of the invention is restricted only within the meaning of the accompanying patent claims and equivalents thereof.

What is claimed is:

1. A reflective optical element, comprising:
    an optically effective surface;
    a substrate;
    a reflection layer system; and
    at least one porous outgassing layer, which at least intermittently releases particles adsorbed in the outgassing layer when the optically effective surface is irradiated by electromagnetic radiation, and which is arranged on a side of the reflection layer system facing the substrate.

2. An optical apparatus, comprising at least one of a microlithographic projection exposure apparatus or a mask inspection apparatus, wherein the at least one apparatus comprises a reflective optical element as claimed in claim 1.

3. The reflective optical element as claimed in claim 1, wherein the outgassing layer has a first porous outgassing layer and a second porous outgassing layer configured to at least intermittently adsorb particles released by the first outgassing layer when the optically effective surface is irradiated by electromagnetic radiation.

4. The reflective optical element as claimed in claim 1, further comprising at least one heat radiation layer, wherein, in comparison with an analogously structured reflective optical element without the heat radiation layer, the reflective optical element increases a radiation of heat induced by the electromagnetic radiation in the reflective optical element when the optically effective surface is irradiated by electromagnetic radiation.

5. The reflective optical element as claimed in claim 4, wherein the heat radiation layer is arranged on a side of the reflection layer system facing the substrate.

6. The reflective optical element as claimed in claim 4, wherein the heat radiation layer is arranged on a side of the reflection layer system facing the optically effective surface.

7. The reflective optical element as claimed in claim 1, configured as a mirror.

8. An optical system comprising at least one reflective optical element as claimed in claim 1.

9. The optical system as claimed in claim 8, further comprising a heat sink arranged on a side of the substrate facing away from the reflection layer system.

10. The optical system as claimed in claim 8, configured as a microlithographic projection exposure apparatus.

11. The optical system as claimed in claim 8, configured as an optical system of a mask inspection apparatus.

12. A microlithographic projection exposure apparatus comprising an illumination device and a projection lens, wherein the projection exposure apparatus has a reflective optical element as claimed in claim 1.

13. A mask inspection apparatus comprising an illumination device and an inspection lens, wherein the mask inspection apparatus comprises a reflective optical element as claimed in claim 1.

14. A reflective optical element, comprising:
    an optically effective surface;
    a substrate; and
    a multilayer system applied directly to the substrate, wherein the multilayer system comprises a reflection layer system and a Peltier element arranged between the substrate and the reflection layer system, wherein the Peltier element is configured to heat the reflection layer system while cooling the substrate.

15. The reflective optical element as claimed in claim 14, wherein the multilayer system further comprises further comprising a heat buffer layer arranged between the substrate and the reflection layer system.

16. The reflective optical element as claimed in claim 14, configured for an operating wavelength of less than 30 nm.

17. A reflective optical element, comprising:
- an optically effective surface;
- a substrate;
- a reflection layer system; and
- at least one heat radiation layer, wherein, in comparison with an analogously structured reflective optical element without the heat radiation layer, the reflective optical element increases a radiation of heat induced by the electromagnetic radiation in the reflective optical element when the optically effective surface is irradiated by electromagnetic radiation, and wherein the heat radiation layer is arranged on a side of the reflection layer system facing the optically effective surface.

18. An optical apparatus, comprising at least one of a microlithographic projection exposure apparatus or a mask inspection apparatus, wherein the at least one apparatus comprises a reflective optical element as claimed in claim 17.

19. The reflective optical element as claimed in claim 17, further comprising a heat insulation layer arranged between the substrate and the reflection layer system.

20. The reflective optical element as claimed in claim 19, wherein the heat insulation layer comprises quartz.

21. The reflective optical element as claimed in claim 17, further comprising a Peltier element arranged between the substrate and the reflection layer system.

* * * * *

UNITED STATES PATENT AND TRADEMARK OFFICE
CERTIFICATE OF CORRECTION

PATENT NO. : 10,338,476 B2
APPLICATION NO. : 16/011019
DATED : July 2, 2019
INVENTOR(S) : Peter Huber It is certified that error appears in the above-identified patent and that said Letters Patent is hereby corrected as shown below:

In the Specification

Column 8, Line 35, delete "appliable" and insert -- applicable -- therefor.

Column 9, Line 54, delete "as a result of the at said mirrors" and insert -- as a result of these mirrors -- therefor.

Signed and Sealed this
Seventh Day of July, 2020

Andrei Iancu
*Director of the United States Patent and Trademark Office*